(12) United States Patent
Yamashita et al.

(10) Patent No.: US 10,374,136 B2
(45) Date of Patent: Aug. 6, 2019

(54) LIGHT EMITTING APPARATUS

(71) Applicant: NICHIA CORPORATION, Anan-shi (JP)

(72) Inventors: Ryohei Yamashita, Tokushima (JP); Ryoichi Yoshimoto, Isa (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/143,383

(22) Filed: Sep. 26, 2018

(65) Prior Publication Data

US 2019/0027667 A1    Jan. 24, 2019

Related U.S. Application Data

(60) Division of application No. 15/404,207, filed on Jan. 12, 2017, now Pat. No. 10,115,876, which is a (Continued)

(30) Foreign Application Priority Data

Mar. 14, 2013  (JP) .................................. 2013-052297

(51) Int. Cl.
*H01L 33/62* (2010.01)
*H01L 33/54* (2010.01)
(Continued)

(52) U.S. Cl.
CPC ............ *H01L 33/62* (2013.01); *H01L 23/495* (2013.01); *H01L 23/49517* (2013.01); (Continued)

(58) Field of Classification Search
CPC ... H01L 33/62; H01L 23/49517; H01L 33/54; H01L 2924/181; H01L 2924/18301; (Continued)

(56) References Cited

U.S. PATENT DOCUMENTS 4,862,246 A    8/1989  Masuda et al.
5,977,630 A   11/1999  Woodworth et al.
(Continued)

FOREIGN PATENT DOCUMENTS

DE    102010034924    2/2012
JP       06-116006    2/1994
(Continued)

OTHER PUBLICATIONS

Extended European Search Report for corresponding EP Application No. 14159836.7-1551, dated Sep. 5, 2014.
(Continued)

*Primary Examiner* — Scott B Geyer
(74) *Attorney, Agent, or Firm* — Mori & Ward, LLP

(57) ABSTRACT

A light emitting apparatus includes a positive lead terminal and a negative lead terminal, each of which includes a first main surface, a second main surface, and an end surface including a first recessed surface area extending from a first point of the first main surface in cross section, and a second recessed surface area extending from a second point of the second main surface in cross section. A distance between a first part of the end surface of the positive lead terminal and a second part of the end surface of the negative lead terminal than a first distance between the first points of the positive lead terminal and the negative lead terminal and a second distance between the second points of the positive lead terminal and the negative lead terminal. The first part and the second part are separated from the first point and the second point.

11 Claims, 4 Drawing Sheets

Related U.S. Application Data continuation of application No. 15/015,246, filed on Feb. 4, 2016, now Pat. No. 9,583,688, which is a continuation of application No. 14/799,597, filed on Jul. 15, 2015, now Pat. No. 9,287,480, which is a continuation of application No. 14/211,051, filed on Mar. 14, 2014, now Pat. No. 9,117,806.

(51) Int. Cl.

| | | |
|---|---|---|
| *H01L 33/48* | (2010.01) | |
| *H01L 23/495* | (2006.01) | |
| *H01L 23/00* | (2006.01) | |
| *H01L 33/52* | (2010.01) | |

(52) U.S. Cl.
CPC ........ *H01L 23/49541* (2013.01); *H01L 24/97* (2013.01); *H01L 33/483* (2013.01); *H01L 33/486* (2013.01); *H01L 33/52* (2013.01); *H01L 33/54* (2013.01); *H01L 23/49548* (2013.01); *H01L 23/49562* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/2919* (2013.01); *H01L 2224/2929* (2013.01); *H01L 2224/29301* (2013.01); *H01L 2224/29339* (2013.01); *H01L 2224/29344* (2013.01); *H01L 2224/29364* (2013.01); *H01L 2224/32245* (2013.01); *H01L 2224/45015* (2013.01); *H01L 2224/4566* (2013.01); *H01L 2224/4568* (2013.01); *H01L 2224/45124* (2013.01); *H01L 2224/45139* (2013.01); *H01L 2224/45144* (2013.01); *H01L 2224/45147* (2013.01); *H01L 2224/45169* (2013.01); *H01L 2224/45173* (2013.01); *H01L 2224/45184* (2013.01); *H01L 2224/45565* (2013.01); *H01L 2224/45624* (2013.01); *H01L 2224/45639* (2013.01); *H01L 2224/45644* (2013.01); *H01L 2224/45647* (2013.01); *H01L 2224/45655* (2013.01); *H01L 2224/45657* (2013.01); *H01L 2224/45673* (2013.01); *H01L 2224/45684* (2013.01); *H01L 2224/48091* (2013.01); *H01L 2224/48247* (2013.01); *H01L 2224/48257* (2013.01); *H01L 2224/73265* (2013.01); *H01L 2224/97* (2013.01); *H01L 2924/0132* (2013.01); *H01L 2924/01079* (2013.01); *H01L 2924/0781* (2013.01); *H01L 2924/07802* (2013.01); *H01L 2924/095* (2013.01); *H01L 2924/12035* (2013.01); *H01L 2924/12041* (2013.01); *H01L 2924/12042* (2013.01); *H01L 2924/181* (2013.01); *H01L 2924/18301* (2013.01); *H01L 2924/20752* (2013.01); *H01L 2933/0033* (2013.01); *H01L 2933/0066* (2013.01)

(58) Field of Classification Search
CPC ......... H01L 23/49548; H01L 23/49562; H01L 23/49541–49565; H01L 23/49838–49844; H01L 2924/171–173
See application file for complete search history.

(56) References Cited

U.S. PATENT DOCUMENTS

| | | |
|---|---|---|
| 6,201,292 B1 | 3/2001 | Yagi et al. |
| 6,483,178 B1 | 11/2002 | Chuang |
| 6,630,728 B2 | 10/2003 | Glenn |
| 7,923,301 B2 | 4/2011 | Lim |
| 8,802,501 B2 | 8/2014 | Camacho et al. |
| 8,933,548 B2 | 1/2015 | Oda et al. |
| 9,117,806 B2 | 8/2015 | Yamashita et al. |
| 9,287,480 B2 | 3/2016 | Yamashita et al. |
| 9,691,689 B2 | 6/2017 | Yoshimoto et al. |
| 2004/0175864 A1 | 9/2004 | Mahle |
| 2004/0207054 A1 | 10/2004 | Brown et al. |
| 2005/0151231 A1 | 7/2005 | Yoshida |
| 2008/0093715 A1 | 4/2008 | Lange et al. |
| 2011/0024786 A1 | 2/2011 | Sugiyama |
| 2011/0068443 A1 | 3/2011 | Abbott |
| 2011/0133232 A1 | 6/2011 | Yoshioka et al. |
| 2012/0273826 A1 | 11/2012 | Yamamoto et al. |
| 2012/0313131 A1 | 12/2012 | Oda et al. |
| 2013/0049061 A1 | 2/2013 | Takeda et al. |
| 2013/0200405 A1 | 8/2013 | Zitzlsperger et al. |
| 2013/0221509 A1 | 8/2013 | Oda et al. |
| 2013/0343067 A1 | 12/2013 | Okada |
| 2014/0353710 A1 | 12/2014 | Zitzlsperger et al. |
| 2015/0318458 A1 | 11/2015 | Yamashita et al. |

FOREIGN PATENT DOCUMENTS

| | | |
|---|---|---|
| JP | 2004-247613 | 9/2004 |
| JP | 2011-146524 | 7/2011 |
| JP | 2011-151069 | 8/2011 |
| JP | 2012-39109 | 2/2012 |
| JP | 2012-191233 | 10/2012 |
| JP | 2014-165262 | 9/2014 |
| TW | 201244180 | 11/2012 |
| WO | WO 2012/117974 | 9/2012 |

OTHER PUBLICATIONS

Taiwanese Office Action for corresponding TW Application No. 103109834, dated Nov. 12, 2015.
Notice of Allowance issued by the U.S. Patent and Trademark Office for the corresponding U.S. Appl. No. 14/211,051, dated Apr. 15, 2015.
Notice of Allowance issued by the U.S. Patent and Trademark Office for the corresponding U.S. Appl. No. 14/799,597, dated Nov. 4, 2015.
Office Action with Form PTO-892 Notice of References issued by the U.S. Patent and Trademark Office for U.S. Appl. No. 15/015,246, dated Jun. 27, 2016.
Notice of Allowance issued by the U.S. Patent and Trademark Office for U.S. Appl. No. 15/015,246, dated Oct. 12, 2016.
Japanese Office Action for corresponding JP Application No. 2013-052297, dated Nov. 8, 2016 (w/ English machine translation).
Extended European Search Report for corresponding EP Application No. 17153341.7-1551, dated Apr. 25, 2017.
Office Action with Form PTO-892 Notice of References issued by the U.S. Patent and Trademark Office for U.S. Appl. No. 15/404,207, dated Mar. 16, 2018.
Notice of Allowance issued by the U.S. Patent and Trademark Office for the parent U.S. Appl. No. 15/404,207, dated Jun. 29, 2018.

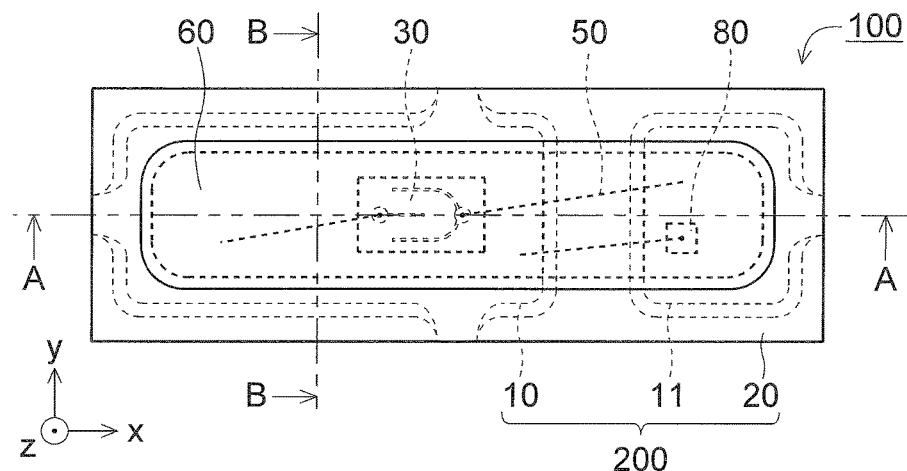
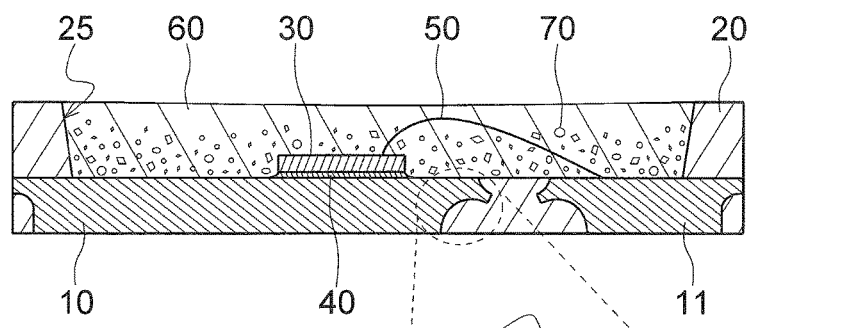
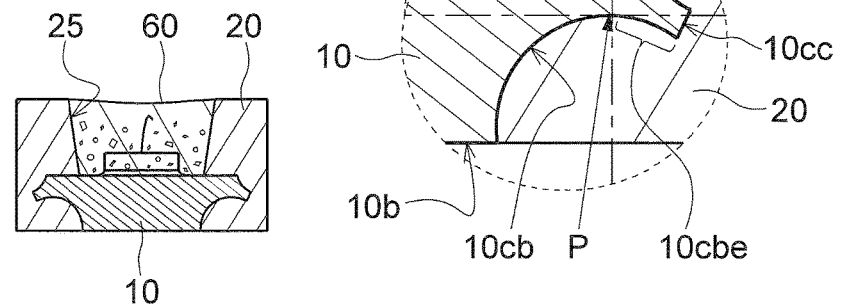

LIGHT EMITTING APPARATUS

CROSS-REFERENCE TO RELATED APPLICATIONS

The present application is a divisional application of the U.S. patent application Ser. No. 15/404,207 filed Jan. 12, 2017, which is a continuation application of the U.S. patent application Ser. No. 15/015,246 filed Feb. 4, 2016, which issued as the U.S. Pat. No. 9,583,688, which is a continuation application of the U.S. patent application Ser. No. 14/799,597 filed Jul. 15, 2015, which issued as the U.S. Pat. No. 9,287,480, which is a continuation application of the U.S. patent application Ser. No. 14/211,051 filed Mar. 14, 2014, which issued as the U.S. Pat. No. 9,117,806, which claims priority under 35 U.S.C. § 119 to Japanese Patent Application No. 2013-052297, filed Mar. 14, 2013. The contents of these applications are incorporated herein by reference in their entirety.

BACKGROUND OF THE INVENTION

1. Field of the Invention

The present invention relates to a light emitting apparatus.

2. Description of the Related Art

See Japanese Patent Laid-Open Publication No. 2012-039,109.

It discloses a semiconductor apparatus including a leadframe that is produced by subjecting both the top and bottom surfaces of a metal base plate to etching, an LED (light emitting diode) device that is arranged on the leadframe, an external resin portion that has a recessed part for enclosing the LED device and is integrally formed with the leadframe, and a sealing resin member with which the recessed part is filled.

SUMMARY OF THE INVENTION

According to one aspect of the present invention, a light emitting device apparatus includes a light emitting device and a light emitting device mount. The light emitting device is mounted on the light emitting device mount. The light emitting device mount includes a positive lead terminal, a negative lead terminal, and a resin portion. Each of the positive lead terminal and the negative lead terminal includes a first main surface, a second main surface, and an end surface. The second main surface is opposite to the first main surface in a thickness direction of each of the positive lead terminal and the negative lead terminal. The end surface is provided between the first main surface and the second main surface. The end surface includes a first recessed surface area and a second recessed surface area. The second recessed surface area is between the positive lead terminal and the negative lead terminal facing each other. The first recessed surface area is extending from a first point of the first main surface in cross section. The second recessed surface area is extending from a second point of the second main surface in cross section. The resin portion is positioned at least between the end surface of the positive lead terminal and the end surface of the negative lead terminal. A distance between a first part of the end surface of the positive lead terminal and a second part of the end surface of the negative lead terminal is smaller than a first distance between the first point of the positive lead terminal and the first point of the negative lead terminal and smaller than a second distance between the second point of the positive lead terminal and the second point of the negative lead terminal as viewed in cross section. The first part is separated from the first point of the end surface of the positive lead terminal and the second point of the end surface of the positive lead terminal. The second part is separated from the first point of the end surface of the negative lead terminal and the second point of the end surface of the negative lead terminal. A length of the second recessed surface area is longer than a length of the first recessed surface area as viewed in cross section.

BRIEF DESCRIPTION OF THE DRAWINGS

FIG. 1A is a schematic plan view schematically showing a light emitting apparatus according to an embodiment of the present invention;

FIG. 1B is a schematic cross-sectional view of the light emitting apparatus taken along the line A-A shown in FIG. 1A;

FIG. 1C is a schematic cross-sectional view of the light emitting apparatus taken along the line B-B shown in FIG. 1A;

DETAILED DESCRIPTION OF THE EMBODIMENTS

Figure 2A:
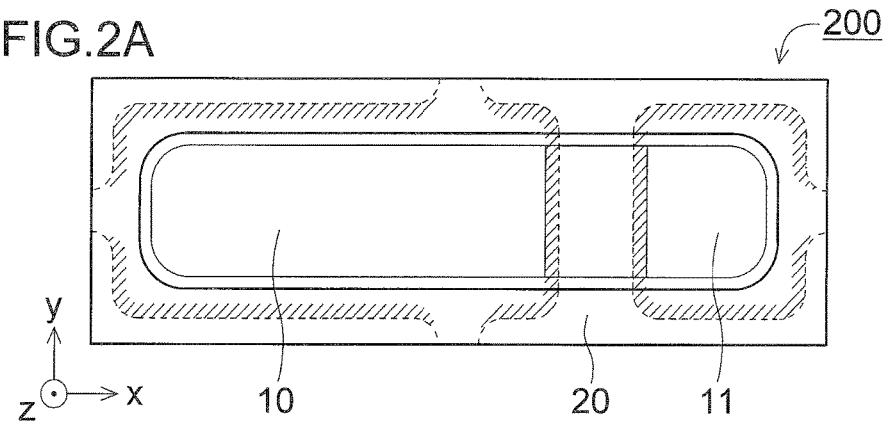
FIG. 2A is a schematic plan view of a light emitting device mount according to an embodiment of the present invention.

The following description will describe embodiments of the present invention with reference to the drawings. It should be appreciated, however, that the embodiments described below are illustrations of a light emitting apparatus, a light emitting device mount, and a leadframe of the present disclosure to give a concrete form to technical ideas of the disclosure, and a light emitting apparatus, a light emitting device mount, and a leadframe of the present disclosure are not specifically limited to description below. In addition, the description for one embodiment may be applied to other embodiments or examples. Additionally, the sizes and the arrangement relationships of the members in each of the drawings are occasionally shown larger exaggeratingly for ease of explanation.

Hereinafter, the "x", "y", and "z" directions shown in the drawings indicate the "length", "width", and "thickness (height)" directions, respectively. Although a light emitting apparatus, a light emitting device mount, and a leadframe according to embodiments described below have a rectangular shape having a long-length and short-length direction as the length and width directions, their shape is not limited to this. For example, they can have a substantially square shape as viewed in plan view.

First Embodiment

Figure 2B:
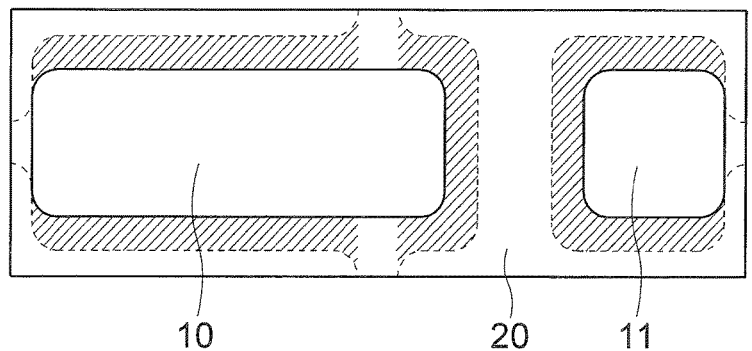
FIG. 2B is a schematic bottom view of the light emitting device mount.
Figure 2C:
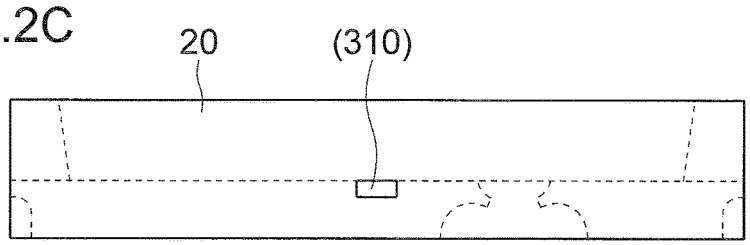
FIG. 2C is a schematic side view of the light emitting device mount.

FIG. 1A is a schematic plan view schematically showing a light emitting apparatus 100 according to a first embodiment of the present invention. FIG. 1B is a schematic cross-sectional view of the light emitting apparatus 100 taken along the line A-A shown in FIG. 1A. FIG. 1C is a schematic cross-sectional view of the light emitting apparatus 100 taken along the line B-B shown in FIG. 1A. FIG. 2A is a schematic plan view of a light emitting device mount 200 according to the first embodiment of the present invention. FIG. 2B is a schematic bottom view of the light emitting device mount 200. FIG. 2C is a schematic side view of the light emitting device mount 200.

As shown in FIGS. 1A to 1C, the light emitting apparatus 100 according to the first embodiment includes the light emitting device mount 200, and a light emitting device 30 that is mounted on the light emitting device mount 200. Specifically, the light emitting apparatus 100 is mainly constructed of the light emitting device 30, the light emitting device mount 200 on which the light emitting device is mounted, and a sealing member 60 that seals the light emitting device. In addition, the sealing member 60 according to this embodiment contains phosphor 70. However, the phosphor may be omitted.

As shown in FIGS. 1A to 1C and 2A to 2C, the light emitting device mount 200 includes lead terminals 10 and 11, and a resin portion 20 that is integrally formed with the lead terminals 10 and 11. Hereinafter, the left and right lead terminals 10 and 11 are occasionally referred to as first and second lead terminals. Although the number of the lead terminals is two in this embodiment, the number of them may be one, or three or more. The lead terminals 10 and 11 are aligned in the length direction of the light emitting device mount 200. The lead terminals 10 and 11 have a plate shape, and are not subjected substantial bending. The first lead terminal 10 has a longer length than the second lead terminal 11. The first and second lead terminals 10 and 11 have substantially the same width. The first lead terminal 10 includes a first main surface 10a, a second main surface 10b that is located on the opposite side to the first main surface 10a, and an end surface that extends from the first and second main surfaces 10a and 10b. In the illustrated embodiment, the first and second main surfaces 10a and 10b of the lead terminals 10 and 11 correspond to the top and bottom surfaces. The lead terminals 10 and 11 are spaced away from each other. The spaced area is filled with the resin portion 20, and serves as an electrically insulating area. Thus, the lead terminals are integrally held with the resin portion 20. The second lead terminal 11 also includes the first and second main surfaces, and the end surfaces. The same as the first lead terminal 11 goes for the second lead terminal. Reference signs are not explicitly attached to the first and second main surfaces and end surface of the second lead terminal, and the description of the first and second main surfaces and end surface of the second lead terminal is omitted for ease of explanation.

It is preferable that the first and second main surfaces 10a and 10b of the lead terminal be flat except for intentionally formed grooves or recessed parts. Also, it is preferable that the first and second main surfaces 10a and 10b of the lead terminal be in substantially parallel to each other except for intentionally formed grooves or recessed parts. Although the first and second lead terminals 10 and 11 may have different maximum widths (mainly maximum width in the width direction), it is preferable that the first and second lead terminals have substantially the same maximum width. Although the first and second lead terminals 10 and 11 may be tilted relative to each other as viewed in plan view, it is preferable that the first and second lead terminals be arranged in substantially parallel to each other. Although the first and second lead terminals 10 and 11 may be arranged with their center axes extending along the length direction being deviated from each other as viewed in plan view, it is preferable that the first and second lead terminals be arranged with their center axes extending along the length direction agreeing with each other as viewed in plan view.

The resin portion 20 has an elongated rectangular shape extending along the length direction as viewed in plan view. A recessed part is formed by the resin portion 20 and the lead terminals 10 and 11, and can accommodate the light emitting device. Specifically, the bottom surface of the recessed part is formed by the upper surfaces of the lead terminals 10 and 11, and the surfaces of the resin portion 20. The side wall surfaces 25 (the interior surfaces of the recess side wall) of the recessed part are formed by the surfaces of the resin portion 20. Although the side wall surfaces 25 of the recessed part may extends in the vertical direction, it is preferable that the side wall surfaces are inclined so that the opening area of the recessed part becomes smaller toward the recessed part bottom surface in order that light emitted from the light emitting device can efficiently outgoes. Although the light emitting device mount includes the recessed part in this embodiment, the recessed part may be omitted. For example, the light emitting device mount can have a plate shape.

The resin portion 20 at least partially covers the end surfaces of the lead terminal with the first and second main surfaces 10a and 10b being at least partially exposed. In this embodiment, the resin portion 20 substantially entirely covers the end surfaces of the lead terminals 10 and 11 except for hanger leads 310. In addition, the resin portion 20 covers parts of the first main surface 10a of the lead terminal (in particular, the peripheral edge parts). The second main surface 10b of the lead terminal is at least partially exposed from the resin portion 20. The bottom surface of the light emitting device mount 200 is formed by the second main surfaces and the resin portion 20. According to this construction, the light emitting device mount can have excellent heat dissipation characteristics.

The end surfaces of the lead terminal include first and second recessed surface areas 10ca and 10cb that extend from the first and second main surfaces 10a and 10b, respectively. The second recessed surface area 10cb includes a closest point P that is positioned closest to the first main surface 10a, and an extension part 10cbe that extends outward of the closest point P and toward the second main surface 10b side. The first recessed surface area 10ca is arranged on the exterior side relative to the closest point P of the second recessed surface area. The "exterior side" or "interior side" of a lead terminal refers to the side from the viewpoint at the center of the lead terminal.

According to the light emitting device mount 200, and the light emitting apparatus 100 including the light emitting device mount, since the surface area of the end surface (i.e., the overall length of the end surface as viewed in cross-section) of the lead terminal 10 or 11 can be increased by the first and second recessed surface areas 10ca and 10cb, it is possible to suppress the leakage of sealing resin material and the entry of solder flux. In addition, it is possible to improve adhesive strength between the peripheral edge parts of the lead terminals 10 and 11, and the resin portion 20. In particular, the extension part 10cbe of the second recessed surface area serves as a barrier for suppressing the leakage of sealing resin material and entry of solder flux. Accordingly, it is possible to effectively suppress the leakage of sealing resin material and the entry of solder flux. In addition, although the lead terminals 10 and 11 are formed thin at the closest point P of the second recessed surface area, since the first recessed surface area 10ca is positioned on the exterior side relative to the closest point P, it is possible to provide sufficient strength to the peripheral edge parts where the lead terminal becomes relatively thin.

The shape of the end surface of the lead terminal 10 or 11 can be formed by the characteristics, shape, positional relationship, or the like of the mask when the leadframe is formed by etching. It is preferable that the first or second recessed surface area 10ca or 10cb be constructed of substantially one curved surface. However, the first or second recessed surface areas may be constructed of combination of flat and curved surfaces, or include convex and concave shapes.

The light emitting apparatus 100 and the light emitting device mount 200 according to the preferable embodiment are now described.

It is preferable that the end surface of the lead terminal include middle area 10cc between the first and second recessed surface areas 10ca and 10cb as shown in FIGS. 1A to 1C. According to this construction, the surface area of the end surface (i.e., the overall length of the end surface as viewed in cross-section) of the lead terminal can be further increased. As a result, it serves to suppress the leakage of sealing resin material and the entry of solder flux. In addition, the thickness between the first and second recessed surface areas 10ca and 10cb can be kept relatively large. Accordingly, it assists to provide sufficient strength to the peripheral edge parts where the lead terminal becomes relatively thin. In the illustrative embodiment, the middle area 10cc extends from the first and second recessed surface areas 10ca and 10cb.

It is preferable that the middle area 10cc be substantially flat as shown in FIGS. 1A to 1C. According to this construction, a bent part can be easily formed at the boundary part portion from the first recessed surface area 10ca to the middle area 10cc and/or the boundary part from the second recessed surface area 10cb to the middle area 10cc. As a result, it helps to suppress the leakage of sealing resin material and the entry of solder flux.

It is preferable that the surface area of the second recessed surface area 10cb be larger than that of the first recessed surface area 10ca as shown in FIGS. 1A to 1C. In other words, it is preferable that the length of the second recessed surface area 10cb be longer than the first recessed surface area 10ca as viewed in cross-section. According to this construction, the extension part 10cbe of the second recessed surface area can have a relatively large surface area. As a result, it facilitates to suppress the leakage of sealing resin material and the entry of solder flux. In addition, the thickness of the resin portion 20 can be easily increased which covers the second recessed surface area 10cb. Accordingly, the lead terminals 10 and 11 can be reliably supported from the second main surfaces 10b side.

It is preferable that the light emitting device be mounted on the first main surface 10a of the lead terminal as shown in FIGS. 1A to 1C. In the case where the light emitting device be mounted on the first main surface 10a of the lead terminal, the extension part 10cbe of the second recessed surface area extends toward the second main surface 10b side. In this case, the resin portion 20 for covering the end surfaces of the lead terminals 10 and 11 on the light emitting device mounting side can be easily made to close tolerances. It results in suppressing the leakage of sealing resin material and the entry of solder flux.

Although the lowest point (maximum depth) of the first recessed surface area 10ca may be lower than the closest point P of the second recessed surface area 10cb, in other words, be positioned on the second main surface 10b side relative to the closest point P, it is preferable that the lowest point of the first recessed surface area be positioned on the first main surface 10a side relative to the closest point P as shown in FIGS. 1A to 1C. In other words, it is preferable that the outside end of the first recessed surface area 10ca be positioned on the first main surface 10a side relative to the closest point P of the second recessed surface area 10cb. In this case, the thickness between the first and second recessed surface areas 10ca and 10cb can be kept relatively large. Accordingly, it enhances sufficient strength to the peripheral edge parts where the lead terminal becomes relatively thin. Also, the first recessed surface area 10ca may include a closest point that is positioned closest to the second main surface 10b (herein after referred to as second closest point), and an extension part that extends outward of the second closest point and toward the first main surface 10a side (herein after referred to as second extension portion). In this case, it is possible to more effectively suppress the leakage of sealing resin material and the entry of solder flux.

In the case where the aforementioned end surface shape is formed on parts of the peripheral edge parts of the lead terminals 10 and 11 except the hanger leads 310 of the lead terminals, it is possible to provide an effect that suppresses the leakage of sealing resin material and the entry of solder flux. In the case where the aforementioned end surface shape is formed on substantially the entire of the peripheral edge parts of the lead terminals 10 and 11 except the hanger leads 310 of the lead terminals (shaded areas in FIGS. 2A and 2B), it is possible to further suppresses the leakage of sealing resin material and the entry of solder flux. For this reason, it is preferable that the aforementioned end surface shape is formed on substantially the entire of the peripheral edge parts of the lead terminals except the hanger leads of the lead terminals. Also, a shape similar to the aforementioned end surface shape, which is formed on the peripheral edge parts of the lead terminals 10 and 11, may be formed on the hanger leads.

Figure 3A:
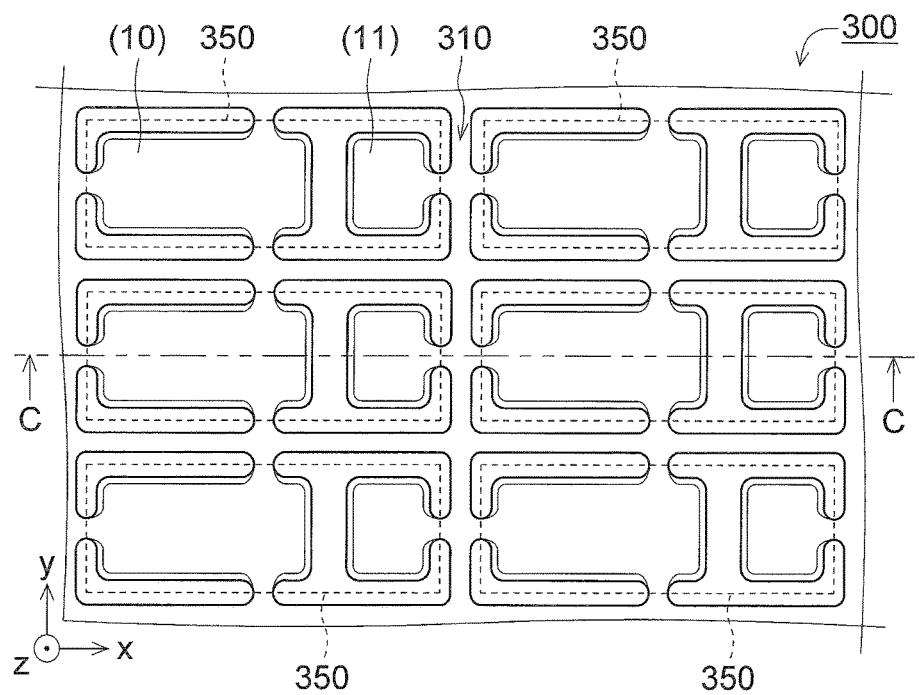
FIG. 3A is a schematic plan view showing a part of a leadframe according to an embodiment of the present invention.
Figure 3B:
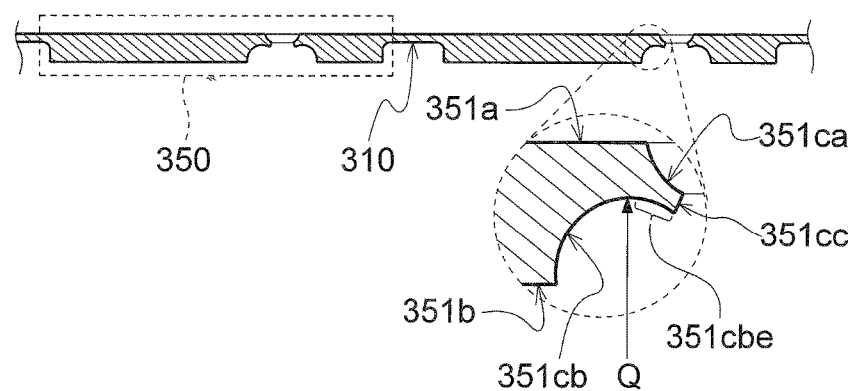
FIG. 3B is a schematic cross-sectional view of the leadframe taken along the line C-C shown in FIG. 3A.

FIG. 3A is a schematic plan view showing a part of a leadframe 300 according to the first embodiment of the present invention. FIG. 3B is a schematic cross-sectional view of the leadframe 300 taken along the line C-C shown in FIG. 3A. The leadframe 300 has a plate shape, and includes the hanger leads 310 and a plurality of lead terminal sets 350 that are connected to the hanger leads 310. The lead terminal set 350 includes a first main surface 351, a second main surface 351b that is located on the opposite side to the first main surface 351a, and end surfaces that extend from the first and second main surfaces 351a and 351b. The end surface of the lead terminal set 350 includes first and second recessed surface areas 351ca and 351cb that extend from the first and second main surfaces 351a and 351b, respectively. The second recessed surface area 351cb includes a closest point Q that is positioned closest to the first main surface 351a, and an extension part 351cbe that extends outward of the closest point Q. The first recessed surface area 351ca is arranged on the exterior side relative to the closest point Q of the second recessed surface area.

As shown in FIGS. 3A and 3B, the lead terminal set 350 includes two separated parts that correspond to the first and second lead terminals 10 and 11 in the light emitting device mount 200. The first main surface 351a, the second main surface 351b, the first recessed surface area 351ca, the second recessed surface area 351cb, the middle area 351cc, the closest point Q, and the extension part 351cbe in this lead terminal set 350 correspond to the first main surface 10a, the second main surface 10b, the first recessed surface area 10ca, the second recessed surface area 10cb, the middle area 10cc, the closest point P, and the extension part 10cbe in the first and second lead terminals, and are constructed similar to the aforementioned lead terminals according to the preferred embodiment.

After the light emitting device mounts are produced by dividing the leadframe into the light emitting device mounts, the hanger leads 310 remain in the resin portion of each of the light emitting device mounts, and parts of the hanger leads are exposed from end surfaces (side surfaces) of each of the light emitting device mounts. If stress is applied from the exterior side onto the light emitting device mount, the stress is likely to concentrate around the hanger lead. As shown in FIGS. 2A, 2B, and 2C, the hanger leads 310 are arranged substantially on the center lines of the light emitting device mount 200 in the length and width directions as viewed in plan view. According to this arrangement, it is possible to improve external stress resistance of the light emitting device mount 200 whereby suppressing resin portion 20 chipping or cracking. Specially, in this embodiment, the first lead terminal 10 has hanger leads 310 that extend in the width direction. On the other hand, the second lead terminal 11 has no hanger lead that extends in the width direction. Each of the first and the second lead terminals 10 and 11 has the hanger lead 310 that extends in the length direction (on the exterior side).

Second Embodiment

Figure 4:
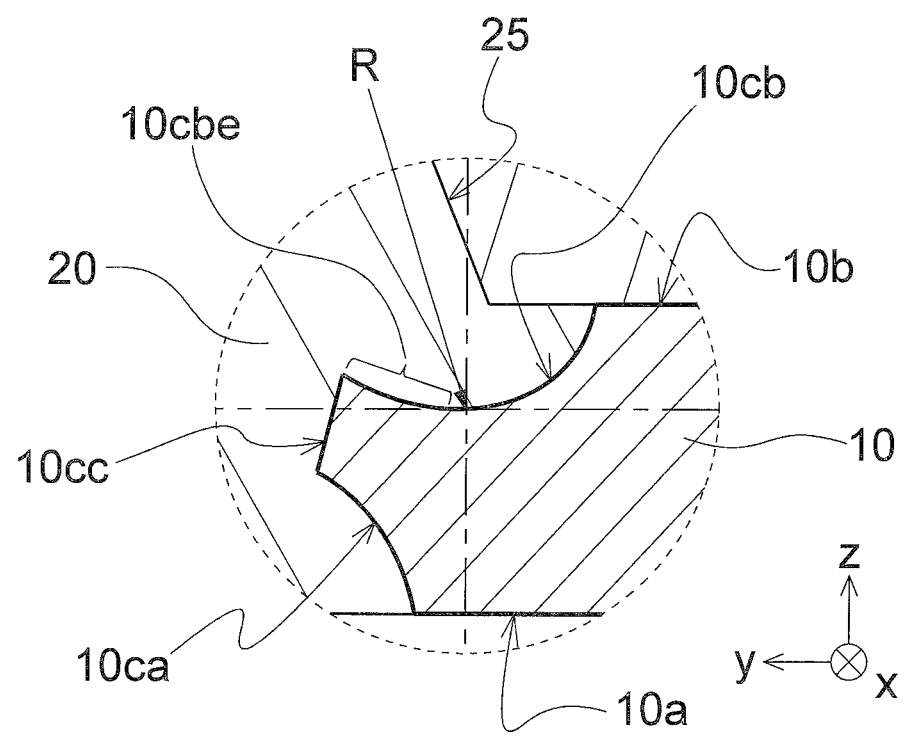
FIG. 4 is an enlarged schematic cross-sectional view showing a part of a light emitting apparatus according to another embodiment of the present invention.

FIG. 4 is an enlarged schematic cross-sectional view showing a part of a light emitting apparatus according to a second embodiment of the present invention. The construction of the light emitting apparatus according to this embodiment shown in FIG. 4 is substantially the same as the light emitting apparatus according to the first embodiment except for the arrangement of the main surfaces of the first and second recessed surface areas in the lead terminal, and the relationship between the lead terminal and the resin portion. The description of the same construction of the light emitting apparatus according to this embodiment is omitted for ease of explanation.

The end surfaces of the lead terminal in the light emitting apparatus according to this embodiment shown in FIG. 4 also include the first and second recessed surface areas 10ca and 10cb that extend from the first and second main surfaces 10a and 10b, respectively. The second recessed surface area 10cb includes a closest point R that is positioned closest to the first main surface 10a, and an extension part 10cbe that extends outward of the closest point R and toward the second main surface 10b side. The first recessed surface area 10ca is arranged on the exterior side relative to the closest point R of the second recessed surface area.

As shown in FIG. 4, in this embodiment, the light emitting device is mounted on the second main surface 10b dissimilar to the first embodiment. In this embodiment, the exposed area of the first main surface 10a can be relatively large. As a result, it is possible to easily improve the heat dissipation characteristics of the light emitting device mount.

As shown in FIG. 4, in this embodiment, the part of the second recessed surface area 10cb as the recessed surface area on the light emitting device mounting side except for portion facing the spaced area between the first and the second lead terminals is located on the interior side relative to the recessed part side wall surface 25. In the case where the part or entire of the recessed surface area on the light emitting device mounting side is located on the interior side relative to the recessed part side wall surface 25, it is possible to suppress or prevent that burrs appear in the contact part of the recessed part side wall surface 25 of the resin portion with the lead terminal 10 or 11. On the other hand, in the first embodiment, the recessed part side wall of the resin portion covers the peripheral edge parts of the first main surface 10a (light emitting device mounting side) of the lead terminal except for portion facing the spaced area between the first and the second lead terminals 10 and 11. Accordingly, since the covered area of the peripheral edge part of the lead terminals 10 and 11 covered by the resin portion 20 can be relatively large, it promotes to suppress the leakage of sealing resin material and the entry of solder flux.

Elements of the light emitting apparatus, the light emitting device mount, and the leadframe according to embodiment of the present invention are now described.

(Lead Terminals 10 and 11, and Leadframe 300)

The lead terminal and the leadframe can be formed of an electrically conductive metal material that can be connected to the light emitting device or a protection device. Specifically, the lead terminal and the leadframe can be formed by subjecting a metal plate (e.g., copper, aluminum, gold, silver, tungsten, iron, nickel, cobalt, molybdenum, an alloy of at least two of them, phosphor bronze, copper containing iron, or the like) to various types of working such as presswork, etching and rolling. In particular, it is preferable that the lead terminal and the leadframe be formed of copper alloy that mainly contains copper. The base material of the lead terminal and the leadframe can be a single layer, or a multilayer containing a plurality of metal layers. In the case where the base material of the lead terminal and the leadframe is a single layer, the lead terminal and the leadframe can be simple. In addition, a coating or a light reflection film of silver, aluminum, rhodium, gold, copper, or an alloy of at least two of them can be formed on the surface of the lead terminal or the leadframe. In particular, it is preferable that the surface of the lead terminal or the leadframe be coated with silver, which has excellent reflection characteristics. Although the thickness of the lead terminal or the leadframe is not limited, the thickness of the lead terminal or the leadframe can be fall within the range from 0.1 to 1 mm, preferably from 0.2 to 0.4 mm, for example.

(Resin Portion 20)

Examples of base materials of the resin portion can be provided by thermosetting resins such as epoxy resin, denatured epoxy resin, silicone resin, denatured silicone resin, polybismaleimide triazine resin, polyimide resin and polyurethane resin, and thermoplastic resins such as aliphatic polyamide resin, semi-aromatic-polyamide resin, polyethylene terephthalate, polycyclohexane terephthalate, liquid crystal polymer, polycarbonate resin, syndiotactic polystyrene, polyphenylene ether, polyphenylene sulfide, polyether sulfone resin, polyether ketone resin and polyarylate resin. In addition, particles of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chrome oxide, manganese oxide, carbon black, or the like as filler or color pigment may be contained in the base material.

(Light Emitting Device 30)

The light emitting device can be semiconductor light emitting devices such as light emitting diode (LED) device and semiconductor laser (Laser Diode: LD) device. The light emitting device can have a semiconductor structure that can be formed of various types of semiconductors. A pair (positive/negative) of electrodes are formed on the semiconductor structure. In particular, the light emitting device is preferably formed of nitride semiconductors ($In_xAl_yGa_{1-x-y}N$, $0 \leq x$, $0 \leq y$, $x+y \leq 1$), which can efficiently excite phosphors. Also, the light emitting device can be gallium arsenide group light emitting devices or gallium phosphide group semiconductors capable of emitting green to red range light. In the case where the pair (positive/negative) of electrodes are formed on one surface side of the light emitting device, the light emitting device can be mounted onto the mount in a face-up mounting manner with the electrodes being connected to the lead terminals by wire lines. In the case where the pair (positive/negative) of electrodes are formed on opposed surfaces of the light emitting device, the bottom surface electrode is connected onto one lead terminal by an electrically conductive adhesive material, and the upper surface electrode is connected to another lead terminal by a wire line. The same goes for a protection element, which is described later. In the case where a metal film (e.g., silver or aluminum film) or dielectric reflection film is formed on the mounting side of the light emitting device, it is possible to improve light outgoing efficiency. One or a plurality of light emitting devices can be mounted onto a single light emitting device mount. The size, shape and light emission wavelength of the light emitting devices can be suitably selected. The plurality of light emitting devices can be connected in series or in parallel to each other through the lead terminal or wire lines. Also, two or three different color light emitting devices can be mounted on a single light emitting device mount. For example, the two different color light emitting devices can be blue and red, or blue and green light emitting devices. The three different color light emitting devices can be blue, green and red light emitting devices.

(Adhesive Member 40)

An adhesive member serves to fix the light emitting device or the protection device onto the light emitting device mount. Electrically insulating adhesive members can be used. Examples of electrically insulating adhesive members can be provided by epoxy resin, silicone resin, polyimide resin, denatured resin obtained by denaturing them, and hybrid resin containing at least two of these resins. Electrically conductive adhesive members can be used. Examples of electrically conductive adhesive members can be provided by electrically conductive paste such as silver, gold and palladium, solder such as tin-bismuth group solder, tin-copper group solder, tin-silver group solder and gold-tin group solder, and wax material such as low melting point metal.

(Wire Line 50)

The wire line serves as an electric conductor for connecting the electrode of the light emitting device or the protection element to the lead terminal. Specifically, the wire line can be a metal wire line of gold, copper, silver, platinum, aluminum, or an alloy at least two of them. In particular, a gold wire line is preferably used which is resistance to disconnection due to a stress from the sealing member, and has excellent in thermal resistance, and the like. In addition, the surface of the wire line may be coated with silver in order to improve light reflection characteristics.

(Sealing Member 60)

The sealing member serves a protection member that covers the light emitting device, the protection device, the wire lines and the like, and protects them from dust, moisture, external force and the like. The sealing member can be formed of an electrically insulating base material that is transparent to the light that is emitted from the light emitting device (preferably has transmittance of not less than 70%). Examples of the base material of the sealing member can be provided by silicone resin, epoxy resin, phenol resin, polycarbonate resin, acrylate resin, TPX resin, polynorbornene resin, denatured resin obtained by denaturing them, and hybrid resin containing one or more types of these resins. The base material of the sealing member may be glass. In particular, it is preferable that the base material of the sealing member be silicone resin. The reason is that silicone resin has good heat resistance and good light resistance, and that the volumetric shrinkage of silicone resin is small after solidified. In addition, the sealing member can contain various types of functional particles (e.g., filler, phosphor, and the like) that are mixed into the base material. A diffusing agent, a coloring agent, and the like can be used as the filler. Examples of the filler can be provided by silica, titanium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, carbon black, and the like. The filler can have granular shapes or spherical shapes. The filler can be hollow particles or porous particles.

(Phosphor 70)

The phosphor absorbs at least part of the primary light emitted from the light emitting device, and emits secondary light with different wavelength from the primary light. Examples of the phosphor can be provided by a nitride group phosphor and a nitride oxide group phosphor that are mainly activated by lanthanoide group elements (e.g., europium and cerium), more specifically, by $\alpha$- and $\beta$-SIALON phosphors, and various types of alkaline earth metal silicate nitride phosphors that are activated by europium. Other examples of the phosphor can be provided by alkaline earth metal halogen apatite phosphor, alkaline earth halosilicate phosphor, alkaline earth metal silicate phosphor, alkaline earth metal halogen borate phosphor, alkaline earth metal aluminate phosphor, alkaline earth metal silicate, alkaline earth metal sulfide, alkaline earth metal thiogallate, alkaline earth metal silicon nitride, germanate that are mainly activated by lanthanoide group elements (e.g., europium) and transition metal group elements (e.g., manganese). Also, other examples of the phosphor can be provided by rare earth aluminate and rare earth silicate that are mainly activated by lanthanoid group elements (e.g., cerium). Still other examples of the phosphor can be provided by organic substance, organic complex, and the like that are mainly activated by lanthanoid group elements (e.g., europium). Any phosphor other than the aforementioned phosphors can be used which has similar performance and effects. According to this construction, it is possible to provide a light emitting apparatus that can emit primary light with a visible wavelength and secondary light with another visible wavelength whereby emitting mixed color light (e.g., white-range light). Also, it is possible to provide a light emitting apparatus that can emit secondary light with a visible wavelength, which is excited by primary light with an ultraviolet wavelength. The phosphor may be mainly located in the lower part of the recessed part, or be distributed in the entire recessed part.

(Protection Device 80)

The protection device serves to protect the light emitting device from static damage or high-voltage surge. Specifically, a Zener diode can be used as the protection device. The protection device can be covered with a light reflection member such as white resin in order to suppress light absorption.

EXAMPLES

The following description will describe a light emitting device mount, a light emitting apparatus including the mount, and a leadframe according to an example of the embodiments of the present invention. Needless to say, the present invention is not limited to the example described below.

Example 1

The light emitting apparatus according to an example 1 is a SMD type LED that emits light upward and has a similar structure to the light emitting apparatus 100 according to the embodiment shown in FIGS. 1A to 1C. The light emitting apparatus has an approximately rectangular box exterior shape. The light emitting apparatus includes the light emitting device mount as package for light emitting apparatus. The light emitting device mount has a length of 3.0 mm, a width of 1.0 mm, and a thickness of 0.52 mm. The resin portion is integrally formed with the first and second lead terminals as positive and negative terminals. The leadframe is first placed into a die. The leadframe includes a plurality of lead terminal sets (pairs of lead terminals) that are arranged in matrix and are held by the hanger leads. Subsequently, a resin material with fluidity is injected into the die. After the resin material is solidified, the leadframe with the resin material is removed from the die. The leadframe with the resin material is divided into the light emitting device mounts. Thus, the light emitting device mounts are produced. Note that the leadframe with the resin material is divided into the light emitting device mounts after the light emitting devices and the like are mounted onto the lead terminals and covered with the sealing members, in practice process.

The first and second lead terminals have a plate shape piece made by copper alloy having a maximum thickness of 0.2 mm. The surfaces of the first and second lead terminals are plated with silver. The main part of the first lead terminal has a rounded rectangular shape having a length of 1.65 mm and a width of 0.67 mm as viewed in plan view (except for hanger leads). The second lead terminal has a rounded rectangular shape having a length of 0.53 mm and a width of 0.67 mm as viewed in plan view (except for hanger leads). The length of the spaced area between the first and second lead terminals is 0.3 mm. The first and second lead terminals have the first and second recessed surface areas, and the middle area on the end surfaces of the first and second lead terminals. The first and second recessed surface areas extend from the top and bottom surfaces, respectively. The middle area extends from the first and second recessed surface areas. The first recessed surface area is a curved area having a width of 0.035 mm and a maximum depth of 0.1 mm. The second recessed surface area is a curved area having a width of 0.135 mm and a maximum depth of 0.1 mm. The second recessed surface area has the extension part that extends outward of the closest point (point at the maximum depth) and toward the bottom surface side. The middle area is a substantially flat area having a width of approximately 0.02 mm. The edge of the first recessed surface area (the boundary between the first recessed surface area and the first main surface) is positioned at the point that is spaced at an interval 0.05 mm away from the closest point of the second recessed surface area on the exterior side. The aforementioned end surface shape is formed on the entire of the peripheral edge parts of each of the lead terminals except for the hanger leads. The aforementioned end surface shape is formed by etching. The exposed areas of the bottom surfaces of the first and second lead terminals are substantially coplanar with the bottom surface of the resin portion. In other words, the exposed areas of the bottom surfaces of the first and second lead terminals serve as the bottom surface of the light emitting apparatus, i.e., the bottom surface of the light emitting device mount. The exposed areas of the bottom surfaces of the first and second lead terminals have a rounded substantially rectangular shape.

The resin portion has a rectangular exterior shape having a length of 3.0 mm and a width of 1.0 mm as viewed in plan view, and has a maximum thickness of 0.52 mm. The resin portion is formed of an epoxy resin containing titanium oxide. The recessed part is formed in roughly the central part on the top surface side of the resin portion, and has a length of 2.6 mm, a width of 0.6 mm and a depth of 0.32 mm. The recessed part has a rounded rectangular shape as viewed in plan view. The inclination angle of the side wall surface of the recessed part is approximately 5 degrees the vertical line from the bottom surface of the recessed part. The resin portion covers the peripheral edge parts of the top surface of and the end surfaces of the lead terminals except for the hanger leads.

A single light emitting device is fixed by an adhesive material of silicone resin onto the top surface of the first lead terminal as the bottom surface of the recessed part of the light emitting device mount. The light emitting device is an LED device that is constructed of n-type, active and p-type nitride semiconductor layers that are laminated on one after another in this order on a sapphire substrate, and can emit blue light (center wavelength of approximately 460 nm). The LED device has a length of 700 $\mu$m, a width of 300 $\mu$m and a thickness of 150 $\mu$m. One of the p- and n-electrodes of the light emitting device is connected to the first lead terminal by the wire line, and another of the p- and n-electrodes is connected to the top surface of the second lead terminal by the wire line. The wire lines are formed from a gold wire line having a diameter of 25 $\mu$m. In addition, a Zener diodes as the protection device is mounted on the top surface of the second lead terminal, and has a length of 155 $\mu$m, a width of 155 $\mu$m and a thickness of 85 $\mu$m. The protection device includes electrodes that are arranged on the opposed surfaces of the protection device. The protection device is fixed by silver paste onto the second lead terminal. The top surface electrode of the protection device is connected to the top surface of the first lead terminal by the wire line.

The recessed part of the light emitting device mount accommodates the light emitting device and the protection device, and is filled up with the sealing member to cover the devices. The sealing member contains silicone resin as base material, and a yttrium aluminum garnet phosphor that is activated by cerium (YAG:Ce), and a filler of silica. The top surface of the sealing member is substantially coplanar with the top surfaces of the recessed part side walls of the resin portion, and is substantially flat. When the sealing member has fluidity, the recessed part of the light emitting device mount is filled up with the sealing member by a dispenser. After that, the sealing member is solidified by heating, or the like.

The aforementioned light emitting apparatus according to the example 1 has similar effects to the light emitting apparatus 100 according to the first embodiment.

A light emitting device mount according to the embodiments of the present invention is provided which includes a pair of positive and negative lead terminal, and a resin portion. The lead terminal includes a first main surface, a second main surface, and an end surface. The second main surface is located on the opposite side to the first main surface. The end surface has first and second recessed surface areas that are extend from the first and second main surfaces, respectively, as viewed in cross-section. The resin portion is integrally formed with the lead terminal, and at least partially covers the end surface so that the first and second main surfaces are at least partially exposed. The resin portion forms a recessed part to accommodate the light emitting device. The second recessed surface area includes a closest point, and an extension part. The closest point is positioned closest to the first main surface. The extension part extends outward of the closest point and toward the second main surface side. The extension part is formed at least on opposing end surfaces of the pair of positive and negative lead terminal. The first recessed surface area is arranged on the exterior side relative to the closest point of the second recessed surface area.

Also, a light emitting apparatus according to the embodiments of the present invention is provided which includes the aforementioned light emitting device mount, and a light emitting device that is mounted on this light emitting device mount.

Also, a leadframe according to the embodiments of the present invention is provided which includes hanger leads, and a plurality of lead terminal sets that are connected to the hanger leads. The leadframe has a plate shape. The lead terminal set includes a first main surface, a second main surface, and end surfaces. The second main surface is located on the opposite side to the first main surface. The end surface has first and second recessed surface areas that are extend from the first and second main surfaces, respectively, as viewed in cross-section. The second recessed surface area includes a closest point, and an extension part. The closest point is positioned closest to the first main surface. The extension part extends outward of the closest point and toward the second main surface side. The extension parts are formed at least on opposing end surfaces in the lead terminal sets. The first recessed surface area is arranged on the exterior side relative to the closest point of the second recessed surface area.

According to the embodiments of the present invention, it is possible to keep the strength of the peripheral edge parts of the leadframe or the lead terminal sets high, while suppressing the leakage of sealing resin material or the entry of solder flux.

A light emitting device mount or a leadframe according to the embodiments of the present invention can be used for packages and mounting boards of SMD type LEDs. Also, a light emitting apparatus including the light emitting device mount or formed by using the lead frame according to the embodiments of the present invention can be used as back light source for liquid crystal display, various types of lighting apparatuses, large size display, and various types of displays for advertisement, information sign, etc., as well as image scanner for digital video camera, facsimile, copier, scanner, etc., projector, and the like.

It should be apparent to those with an ordinary skill in the art that while various embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting apparatus comprising:
   a light emitting device;
   a light emitting device mount on which said light emitting device is mounted, said light emitting device mount comprising:
      a positive lead terminal and a negative lead terminal, each of which includes
         a first main surface,
         a second main surface opposite to said first main surface in a thickness direction of each of said positive lead terminal and said negative lead terminal, and
         an end surface which is provided between said first main surface and said second main surface, said end surface including
            a first recessed surface area, and
            a second recessed surface area between said positive lead terminal and said negative lead terminal facing each other, said first recessed surface area extending from a first point of said first main surface in cross section, said second recessed surface area extending from a second point of said second main surface in cross section; and
      a resin portion positioned at least between said end surface of said positive lead terminal and said end surface of said negative lead terminal,
   wherein a distance between a first part of said end surface of said positive lead terminal and a second part of said end surface of said negative lead terminal is smaller than a first distance between said first point of said positive lead terminal and said first point of said negative lead terminal and smaller than a second distance between said second point of said positive lead terminal and said second point of said negative lead terminal as viewed in cross section, said first part being separated from said first point of said end surface of said positive lead terminal and said second point of said end surface of said positive lead terminal, said second part being separated from said first point of said end surface of said negative lead terminal and said second point of said end surface of said negative lead terminal, and
   wherein a length of said second recessed surface area is longer than a length of said first recessed surface area as viewed in cross section.

2. The light emitting apparatus according to claim 1,
   wherein one of said positive lead terminal and said negative lead terminal includes a hanger lead cutting trace exposed from said resin portion at least at one side surface of said light emitting apparatus, and
   wherein said hanger lead cutting trace is arranged in an area close to said at least one side surface of said resin portion and away from said end surface including said first recessed surface area and said second recessed surface area.

3. The light emitting apparatus according to claim 1,
   wherein one of said positive lead terminal and said negative lead terminal includes a hanger lead cutting trace exposed from said resin portion at least at one side surface of said light emitting apparatus, and
   wherein an exposed surface of said hanger lead cutting trace is arranged higher than said second recessed surface area.

4. The light emitting apparatus according to claim 1,
wherein one of said positive lead terminal and said negative lead terminal includes hanger lead cutting traces, said hanger lead cutting trace being exposed from said resin portion at each of three side surfaces of said light emitting apparatus, and
wherein another of said positive lead terminal and said negative lead terminal includes a hanger lead cutting trace exposed from said resin portion at one side surface of said light emitting apparatus.

5. The light emitting apparatus according to claim 1,
wherein said light emitting apparatus has an elongated rectangular shape, and
wherein a part of each side surface area of said positive lead terminal and said negative lead terminal in an elongated direction is arranged away from said end surface including said first recessed surface area and said second recessed surface area.

6. The light emitting apparatus according to claim 1,
wherein said first distance is smaller than said second distance.

7. The light emitting apparatus according to claim 1,
wherein said light emitting apparatus device mount includes longer side surfaces and shorter side surfaces in a plan view, and
wherein said longer side surface has a first hanger lead cutting trace at a substantially center thereof, said first hanger lead cutting trace being a part of one of said positive and negative lead terminals exposed from said resin portion at a side surface of said light emitting apparatus device.

8. The light emitting apparatus according to claim 7,
wherein said shorter side surface has a second hanger lead cutting trace at a substantially center thereof.

9. The light emitting apparatus according to claim 1,
wherein said light emitting apparatus defines a recessed part formed by each part of said positive lead terminal and said negative lead terminal, and said resin portion, and
wherein said light emitting device is mounted on a bottom surface of said recessed part.

10. The light emitting apparatus according to claim 1,
wherein one of said positive lead terminal and said negative lead terminal has a longer length than another of said positive lead terminal and said negative lead terminal in a direction substantially parallel to said first main surface in cross section.

11. The light emitting apparatus device mount according to claim 1,
wherein said positive lead terminal and said negative lead terminal have substantially the same width in a plan view.

* * * * *